United States Patent
Yang (10) Patent No.: US 10,976,765 B2
(45) Date of Patent: Apr. 13, 2021

(54) CURRENT GENERATING CIRCUIT GENERATING A CURRENT RELEVANT TO A REFERENCE VOLTAGE

(71) Applicant: Chengdu Monolithic Power Systems Co., Ltd., Chengdu (CN)

(72) Inventor: Zhijiang Yang, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/711,391

(22) Filed: Dec. 11, 2019

(65) Prior Publication Data
US 2020/0192413 A1    Jun. 18, 2020

(30) Foreign Application Priority Data
Dec. 13, 2018 (CN) .......................... 201811523462.6

(51) Int. Cl.
G05F 3/26 (2006.01)
H03L 7/093 (2006.01)
H03L 7/099 (2006.01)

(52) U.S. Cl.
CPC .............. *G05F 3/262* (2013.01); *H03L 7/093* (2013.01); *H03L 7/099* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,150,887 A | * | 11/2000 | Yamaguchi | H03L 7/0805 327/156 |
| 7,884,654 B2 | * | 2/2011 | Pauritsch | H04B 3/548 327/147 |
| 9,099,994 B2 | * | 8/2015 | Thomsen | H03K 3/0231 |
| 2003/0076140 A1 | * | 4/2003 | Asano | H03L 7/0898 327/157 |
| 2003/0137328 A1 | * | 7/2003 | Kurd | H03L 7/099 327/156 |
| 2003/0203724 A1 | * | 10/2003 | Luo | H03L 7/0893 455/147 |
| 2006/0056491 A1 | * | 3/2006 | Lim | H03L 7/0805 375/130 |
| 2006/0170505 A1 | * | 8/2006 | Humphreys | H03L 7/1976 331/16 |
| 2007/0018736 A1 | * | 1/2007 | Sohn | H03L 7/0893 331/16 |
| 2007/0103247 A1 | * | 5/2007 | Yokota | H03B 21/01 331/158 |

(Continued)

*Primary Examiner* — Adam D Houston
(74) *Attorney, Agent, or Firm* — Perkins Coie LLP (57) ABSTRACT

A current generating circuit generating a current relevant to a reference voltage. The current generating circuit has a reference clock generating circuit generating a reference clock signal which has a frequency relevant to the reference voltage. The current generating circuit has a phase locked loop circuit generating a calibration clock signal. The phase clocked loop circuit regulates the calibration clock signal so that the phase difference between the calibration clock signal and the reference clock signal is reduced. The current generating circuit has also an output circuit generating an output current according to the phase difference between the calibration clock signal and the reference clock signal.

20 Claims, 5 Drawing Sheets

(56) References Cited

U.S. PATENT DOCUMENTS

| | | | |
|---|---|---|---|
| 2010/0045218 A1* | 2/2010 | Tomigashi | H02P 6/183 318/400.02 |
| 2011/0063004 A1* | 3/2011 | Chen | H03L 7/093 327/157 |
| 2011/0102090 A1* | 5/2011 | Yen | H03C 3/0916 331/2 |
| 2011/0273231 A1* | 11/2011 | Nakamura | G05F 3/262 330/257 |
| 2012/0319786 A1* | 12/2012 | kumar | H03L 7/093 331/1 R |
| 2013/0285722 A1* | 10/2013 | Chou | H03L 7/0995 327/157 |
| 2013/0300471 A1* | 11/2013 | Yang | H03L 7/093 327/157 |
| 2013/0308735 A1* | 11/2013 | Namdar-Mehdiabadi | H04L 7/0045 375/376 |
| 2014/0210386 A1* | 7/2014 | Zhao | H02P 21/12 318/400.02 |
| 2014/0210387 A1* | 7/2014 | Zhao | H02P 21/18 318/400.02 |
| 2014/0333241 A1* | 11/2014 | Zhao | H02P 6/08 318/400.02 |
| 2015/0115932 A1* | 4/2015 | Michelutti | G01D 3/028 324/71.1 |
| 2015/0222278 A1* | 8/2015 | Reichelt | H03K 5/135 327/156 |
| 2016/0097638 A1* | 4/2016 | Fedigan | G01C 9/06 324/71.1 |
| 2016/0233869 A1* | 8/2016 | Khoury | H04J 3/06 |
| 2016/0248579 A1* | 8/2016 | Hirai | H03L 7/0893 |
| 2016/0373120 A1* | 12/2016 | Caffee | H03L 7/0814 |
| 2018/0254964 A1* | 9/2018 | Kwan | H04L 41/084 |
| 2019/0222201 A1* | 7/2019 | Wang | H03L 7/0995 |
| 2020/0099383 A1* | 3/2020 | Kubo | H03L 7/0898 |
| 2020/0112316 A1* | 4/2020 | Fujita | H03L 7/089 |
| 2020/0177120 A1* | 6/2020 | Pullen | H02P 23/14 |
| 2020/0192413 A1* | 6/2020 | Yang | H03L 7/093 |
| 2020/0195262 A1* | 6/2020 | Chung | H03L 7/093 |
| 2020/0264653 A1* | 8/2020 | Vincent | G06F 1/12 |
| 2020/0321872 A1* | 10/2020 | Upadhyaya | H02M 3/157 |

\* cited by examiner

CURRENT GENERATING CIRCUIT GENERATING A CURRENT RELEVANT TO A REFERENCE VOLTAGE

CROSS-REFERENCE TO RELATED APPLICATIONS

This application claims the benefit of CN application No. 201811523462.6, filed on Dec. 13, 2018, and incorporated herein by reference.

FIELD OF THE INVENTION

The present invention relates generally to electronic circuits, more specifically but not exclusively to current generating circuits and hall circuits.

BACKGROUND OF THE INVENTION

In some applications, e.g., in some hall circuits, a current proportional to a reference voltage is desired. For a typical PTAP (Proportional to absolute temperature) current generating circuit, the PTAT current generated is often relevant to an absolute temperature but not relevant to a reference voltage. However, for a PTAT current used in some applications, for example, a PTAT current used as a bias current for some hall circuits, it is desired that the PTAT current is relevant to a reference voltage and varies with this reference voltage, for example, being proportional to the reference voltage, and further for example, being directly proportional to the reference voltage.

Thus, there's a need to address at least the above mentioned or other issues.

SUMMARY

Embodiments of the present invention are directed to a current generating circuit, comprising: a reference clock generating circuit configured to generate a reference clock signal, wherein the frequency of the reference clock signal is relevant to a reference voltage; a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and an output circuit coupled to the phase locked loop circuit, wherein the phase locked loop circuit is configured to control the output circuit so that the output circuit generates an output current according to the phase difference between the calibration clock signal and the reference clock signal.

Embodiments of the present invention are also directed to a hall circuit, comprising: a current generating circuit configured to generate an output current, wherein the current generating circuit is configured to comprise: a reference clock generating circuit configured to generate a reference clock signal, wherein the frequency of the reference clock signal is relevant to a reference voltage; a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and an output circuit coupled to the phase locked loop circuit, wherein the phase locked loop circuit is configured to control the output circuit so that the output circuit generates an output current according to the phase difference between the calibration clock signal and the reference clock signal; a hall sensor coupled to the current generating circuit to receive the output current, wherein the hall sensor is configured to generate a hall voltage according to the output current; and an amplifying system coupled to the hall sensor to receive the hall voltage and configured to generate an output voltage according to the hall voltage.

Embodiments of the present invention are further directed to a current generating circuit, comprising: a reference clock generating circuit configured to generate a reference clock signal, wherein the reference clock generating circuit comprises: a reference current source having an output terminal, wherein the reference current source is configured to provide a reference current proportional to the reference voltage at the output terminal; a first capacitor and a first switch both coupled between the output terminal of the reference current source and a reference ground, wherein across the first capacitor there exists a first capacitor voltage; a first comparator having a first input terminal, a second input terminal and an output terminal, wherein the first input terminal is configured to receive a first voltage and the second input terminal is coupled to the output terminal of the reference current source, and wherein the first comparator is configured to compare the first voltage with the first capacitor voltage and to generate a first comparison signal at the output terminal; and a first inverter having an input terminal and an output terminal, wherein the input terminal of the first inverter is coupled to the output terminal of the first comparator and the first inverter is configured to generate the reference clock signal at the output terminal, and wherein the reference clock is provided to control the on and off operations of the first switch; a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and an output circuit coupled to the phase locked loop circuit, wherein the phase locked loop circuit is configured to control the output circuit so that the output circuit generates an output current according to the phase difference between the calibration clock signal and the reference clock signal.

DESCRIPTION OF THE DRAWINGS

The present invention can be further understood with reference to the following detailed description and the appended drawings, wherein like elements are provided with like reference numerals.

DESCRIPTION

The present invention is now described. While it is disclosed in its preferred form, the specific embodiments of the invention as disclosed herein and illustrated in the drawings are not to be considered in a limiting sense. Rather, these embodiments are provided so that this invention will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or one embodiment combining software and hardware aspects. The following detailed description is, therefore, not to be taken in a limiting sense.

Throughout the specification, the meaning of "a," "an," and "the" may also include plural references.

Figure 1:
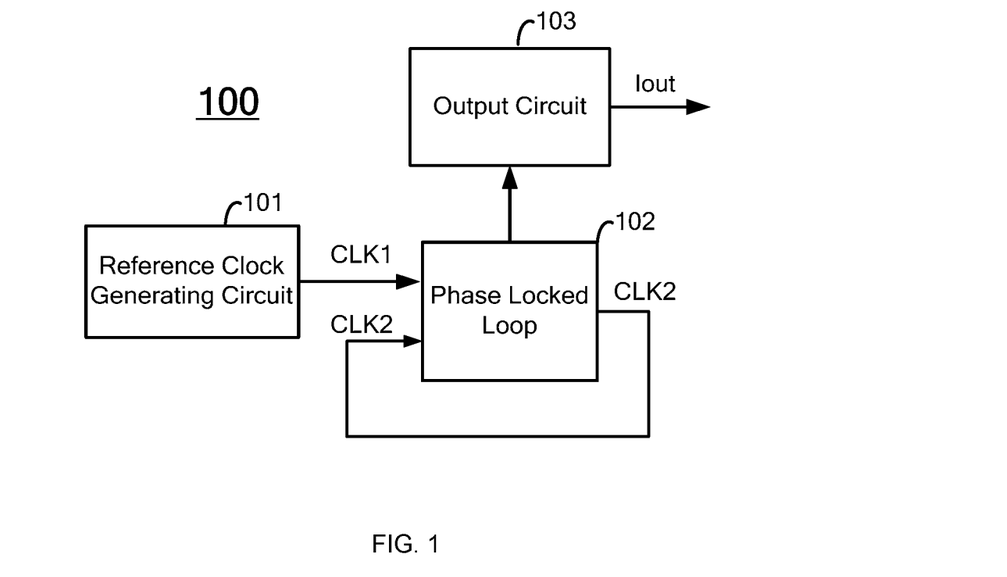
FIG. 1 illustrates a current generating circuit 100 in accordance with an embodiment of the present invention.

FIG. 1 illustrates a current generating circuit 100 in accordance with an embodiment of the present invention. As shown in FIG. 1, the current generating circuit 100 is configured to comprise a reference clock generating circuit 101, a phase locked loop circuit 102 and an output circuit 103. The reference clock generating circuit 101 is configured to generate a reference clock signal CLK1 with a frequency $f_{CLK1}$, wherein the frequency $f_{CLK1}$ is relevant to a reference voltage $V_{REF}$, that is, the frequency $f_{CLK1}$ varies with the reference voltage $V_{REF}$. More specifically, the frequency $f_{CLK1}$ is proportional to the reference voltage $V_{REF}$.

Figure 2:
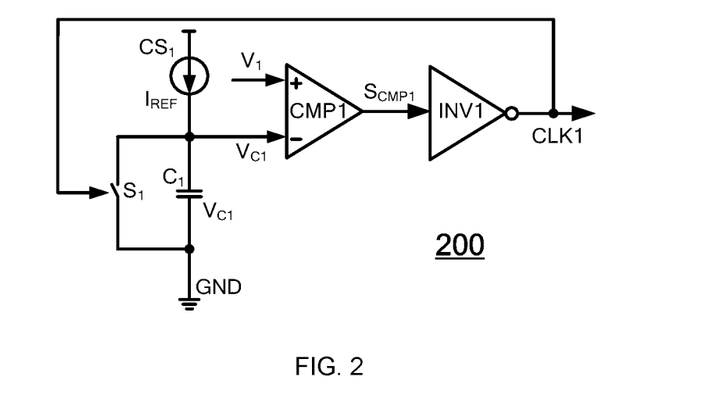
FIG. 2 illustrates a reference clock generating circuit 200 implemented as the reference clock generating circuit 101 of FIG. 1 in accordance with an embodiment of the present invention.

FIG. 2 illustrates a reference clock generating circuit 200 implemented as the reference clock generating circuit 101 of FIG. 1 in accordance with an embodiment of the present invention. As shown in FIG. 2, the reference clock generating circuit 200 is configured to comprise a reference current source $CS_1$, a first capacitor $C_1$, a first switch $S_1$, a first comparator CMP1 and a first inverter INV1. The reference current source $CS_1$ has an output terminal and the reference current source $CS_1$ is configured to generate a reference current $I_{REF}$ at the output terminal, wherein the reference current $I_{REF}$ is proportional to a reference voltage $V_{REF}$, that is, $I_{REF}=k \times V_{REF}$, wherein k is a scale factor, and the reference current $I_{REF}$ has a direction flowing out from the reference current source $CS_1$. Both the first capacitor $C_1$ and the first switch $S_1$ are coupled between the output terminal of the reference current source $CS_1$ and a reference ground GND. The first capacitor $C_1$ has a first capacitor voltage $V_{C1}$ thereacross. The first comparator CMP1 has a first input terminal, a second input terminal and an output terminal, wherein the first input terminal is configured to receive a first voltage $V_1$, and the second input terminal is coupled to the output terminal of the reference current source $CS_1$ to receive the first capacitor voltage $V_{C1}$ across the first capacitor $C_1$. In an embodiment, the first voltage $V_1$ is a bandgap reference voltage, and by implementing the first voltage $V_1$ with the bandgap reference voltage, the accuracy of the reference clock generating circuit 200 can be controlled within 2%. In an embodiment, the first input terminal of the first comparator CMP1 is a non-inverting input terminal, and the second input terminal of the first comparator CMP1 is an inverting input terminal. The first comparator CMP1 is configured to compare the first voltage $V_1$ with the first capacitor voltage $V_{C1}$ and to generate a first comparison signal $S_{CMP1}$ at its output terminal. The first inverter INV1 has an input terminal and an output terminal, wherein the input terminal of the first inverter INV1 is coupled to the output terminal of the first comparator CMP1 to receive the first comparison signal $S_{CMP1}$, and the first inverter INV1 is configured to generate a reference clock signal CLK1 at its output terminal, and the output terminal of the first inverter INV1 is coupled to the first switch $S_1$ to control the on and off operations of the first switch $S_1$.

When the reference clock generating circuit 200 operates, the reference current $I_{REF}$ charges the first capacitor $C_1$, and accordingly, the first capacitor voltage $V_{C1}$ across the first capacitor $C_1$ increases gradually from zero and stops increasing until reaching the first voltage $V_1$. During this process, the first comparison signal $S_{CMP1}$ from the first comparator CMP1 keeps at the high level as the first capacitor voltage $V_{C1}$ is lower than the first voltage $V_1$, and in turn, through the first inverter INV1, the low level reference clock signal CLK1 is provided by the reference clock generating circuit 200. The low level reference clock signal CLK1 is provided to turn off the first switch $S_1$, which ensures that the first capacitor $C_1$ keeps being charged during this process. When the first capacitor voltage $V_{C1}$ reaches the first voltage $V_1$, the first comparison signal $S_{CMP1}$ from the first comparator CMP1 keeps at the low level, and in turn, through the first inverter INV1, a high level reference clock signal CLK1 is provided by the reference clock generating circuit 200. The high level reference clock signal CLK1 is provided to turn on the first switch $S_1$, which makes the first capacitor $C_1$ be discharged and the first capacitor voltage $V_{C1}$ is reset to zero. And afterwards, the reference clock generating circuit 200 enters into a new cycle. The reference current $I_{REF}$ charges the first capacitor $C_1$ again, and accordingly, the first capacitor voltage $V_{C1}$ across the first capacitor $C_1$ increases gradually from zero.

From the above description, it is known that, the frequency $f_{CLK1}$ of the reference clock signal CLK1 is:

$$f_{CLK1} = \frac{k \times V_{REF}}{V_1 \times C_1}$$

The phase locked loop circuit 102 is configured to generate a calibration clock signal CLK2. The phase locked loop circuit 102 is coupled to the reference clock generating circuit 101 to receive the reference clock signal CLK1, and in addition, the phase locked loop circuit 102 is configured to receive the calibration clock signal CLK2 it generates. The phase locked loop circuit 102 regulates the calibration clock signal CLK2 according to the phase difference $D_{PH}$ between the calibration clock signal CLK2 and the reference clock signal CLK1, so that the phase difference $D_{PH}$ decreases gradually and the phase of the calibration clock signal CLK2 aligns with the phase of the reference clock signal CLK1 and the phase locked loop circuit 102 locks the phase of the calibration clock signal CLK2 eventually.

Figure 3:
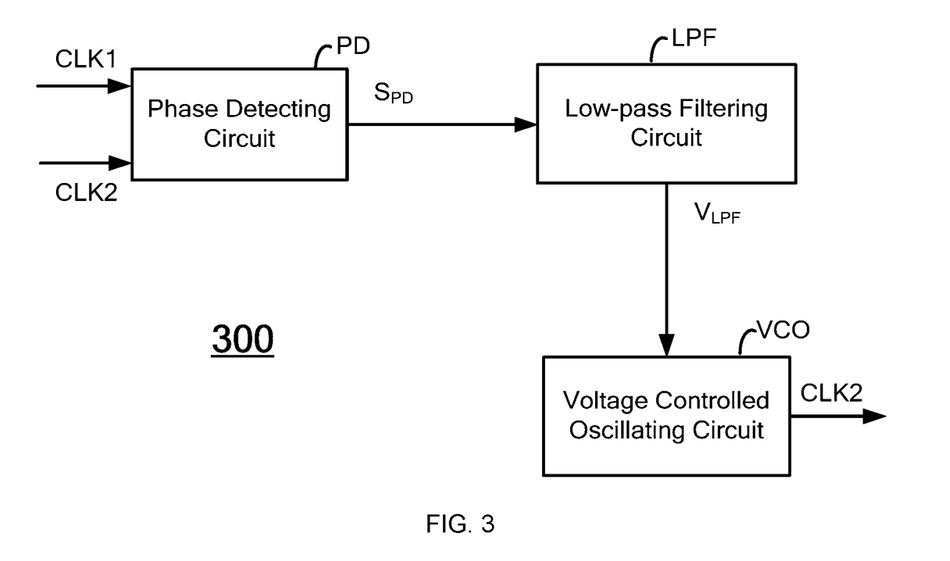
FIG. 3 illustrates a phase locked loop circuit 300 implemented as the phase locked loop circuit 102 of FIG. 1 in accordance with an embodiment of the present invention.

FIG. 3 illustrates a phase locked loop circuit 300 implemented as the phase locked loop circuit 102 of FIG. 1 in accordance with an embodiment of the present invention. As shown in FIG. 3, the phase locked loop circuit 300 is configured to comprise a phase detecting circuit PD, a low-pass filtering circuit LPF and a voltage controlled oscillating circuit VCO. The phase detecting circuit PD has a first input terminal, a second input terminal and an output terminal, wherein the first input terminal of the phase detecting circuit PD is configured to receive the reference clock signal CLK1, the second input terminal of the phase detecting circuit PD is configured to receive the calibration clock signal CLK2, and the phase detecting circuit PD is configured to generate a voltage error signal $S_{PD}$, the voltage error signal $S_{PD}$ has a relationship with the phase difference $D_{PH}$, wherein the relationship can be cosine function, sawtooth function, or triangle function etc. In an embodiment, the average value of the voltage error signal $S_{PD}$ is in a linear relationship with the phase difference $D_{PH}$. In a further embodiment, the average value of the voltage error signal $S_{PD}$ is proportional to the phase difference $D_{PH}$. Yet in another embodiment, the phase detecting circuit PD may be implemented by an XOR gate.

The low-pass filtering circuit LPF has an input terminal and an output terminal, wherein the input terminal of the low-pass filtering circuit LPF is coupled to the phase detecting circuit PD to receive the voltage error signal $S_{PD}$. The low-pass filtering circuit LPF filters the high frequency of the voltage error signal $S_{PD}$ to generate a filtering signal $V_{LPF}$ at it output terminal. In an embodiment, the low-pass filtering circuit LPF is a traditional LC low-pass filtering circuit.

The voltage controlled oscillating circuit VCO has an input terminal and an output terminal, wherein the input terminal of the voltage controlled oscillating circuit VCO is coupled to the low-pass filtering circuit LPF to receive the filtering signal $V_{LPF}$. The voltage controlled oscillating circuit VCO is configured to generate the calibration clock signal CLK2 at its output terminal and to regulate the calibration clock signal CLK2 according to the filtering signal $V_{LPF}$ so as to adjust the frequency of the calibration clock signal CLK2 to reduce the phase difference between the calibration clock signal CLK2 and the reference clock signal CLK1.

Figure 4:
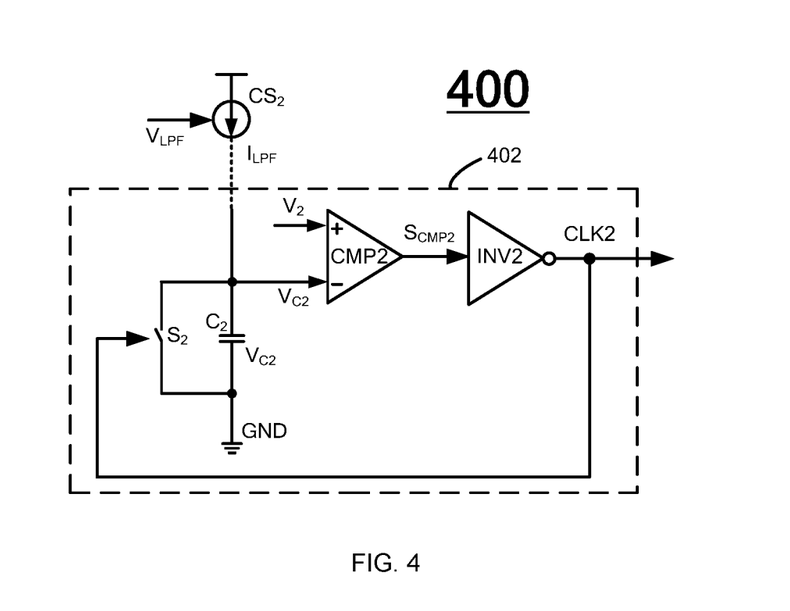
FIG. 4 illustrates a voltage controlled oscillating circuit 400 implemented as the voltage controlled oscillating circuit VCO of FIG. 3 in accordance with an embodiment of the present invention.

FIG. 4 illustrates a voltage controlled oscillating circuit 400 implemented as the voltage controlled oscillating circuit VCO of FIG. 3 in accordance with an embodiment of the present invention. As shown in FIG. 4, the voltage controlled oscillating circuit 400 is configured to comprise a controlled current source $CS_2$ and a calibration clock generating circuit 402. The controlled current source $CS_2$ is configured to receive the filtering signal $V_{LPF}$ and to generate a controlled current $I_{LPF}$ according to the filtering signal $V_{LPF}$. In an embodiment, the controlled current $I_{LPF}$ is proportional to the filtering signal $V_{LPF}$.

The calibration clock generating circuit 402 is coupled to the controlled current source $CS_2$ to receive the controlled current $I_{LPF}$ and is configured to generate the calibration clock signal CLK2 according to the controlled current $I_{LPF}$, wherein the frequency $f_{CLK2}$ of the calibration clock signal CLK2 is proportional to the controlled current $I_{LPF}$. The calibration clock generating circuit 402 is configured to comprise a second capacitor $C_2$, a second switch $S_2$, a second comparator CMP2 and a second inverter INV2. Both the second capacitor $C_2$ and the second switch $S_2$ are coupled between the controlled current source $CS_2$ and the reference ground GND, and a second capacitor voltage $V_{C2}$ exists across the second capacitor $C_2$. The second comparator CMP2 has a first input terminal, a second input terminal and an output terminal, wherein the first input terminal is configured to receive a second voltage $V_2$, and the second input terminal is coupled to the output terminal of the controlled current source $CS_2$ to receive the second capacitor voltage $V_{C2}$ across the second capacitor $C_2$. In an embodiment, the second voltage $V_2$ is the junction voltage $V_T \ln 8$ of a bipolar transistor of a common bandgap reference current source, wherein $V_T$ is the thermal voltage. In an embodiment, the first input terminal of the second comparator CMP2 is a non-inverting input terminal, and the second input terminal of the second comparator CMP2 is an inverting input terminal. The second comparator CMP2 compares the second voltage $V_2$ with the second capacitor voltage $V_{C2}$ and generates a second comparison signal $S_{CMP2}$. The second inverter INV2 has an input terminal and an output terminal, wherein the input terminal of the second inverter INV2 is coupled to the output terminal of the second comparator CMP2, and the output terminal of the second inverter INV2 is coupled to the second switch $S_2$. The second inverter INV2 is configured to generate the reference clock signal CLK2 at its output terminal to control the on and off operations of the second switch $S_2$.

When the calibration clock generating circuit 402 operates, the controlled current $I_{LPF}$ charges the second capacitor $C_2$, and accordingly, the second capacitor voltage $V_{C2}$ across the second capacitor $C_2$ increases gradually from zero and stops increasing until reaching the second voltage $V_2$. During this process, the second comparison signal $S_{CMP2}$ from the second comparator CMP2 keeps at the high level as the second capacitor voltage $V_{C2}$ is lower than the second voltage $V_2$, and in turn, through the second inverter INV2, the low level calibration clock signal CLK2 is provided by the calibration clock generating circuit 402. The low level reference clock signal CLK2 is provided to turn off the second switch $S_2$, which ensures that the second capacitor $C_2$ keeps being charged during this process. When the second capacitor voltage $V_{C2}$ reaches the second voltage $V_2$, the second comparison signal $S_{CMP2}$ from the second comparator CMP2 keeps at the low level, and in turn, through the second inverter INV2, the high level calibration clock signal CLK2 is provided by the calibration clock generating circuit 402. The high level calibration clock signal CLK2 is provided to turn on the second switch $S_2$, which makes that the second capacitor $C_2$ be discharged and the second capacitor voltage $V_{C2}$ is reset to zero. And afterwards, the calibration clock generating circuit 402 enters into a new cycle. The controlled current $I_{LPF}$ charges the second capacitor $C_2$ again, and accordingly, the second capacitor voltage $V_{C2}$ across the second capacitor $C_2$ increases gradually from zero.

From the above description, it is known that, the frequency $f_{CLK2}$ of the calibration clock signal CLK2 is:

$$f_{CLK2} = \frac{I_{LPF}}{V_2 \times C_2}$$

Persons of ordinary skill in the art will understand that, the configuration of the calibration clock generating circuit 402 is only for illustration, any appropriate configuration which has the frequency $f_{CLK2}$ of the calibration clock signal CLK2 proportional to the controlled current $I_{LPF}$ may be used in the present invention.

Figure 5:
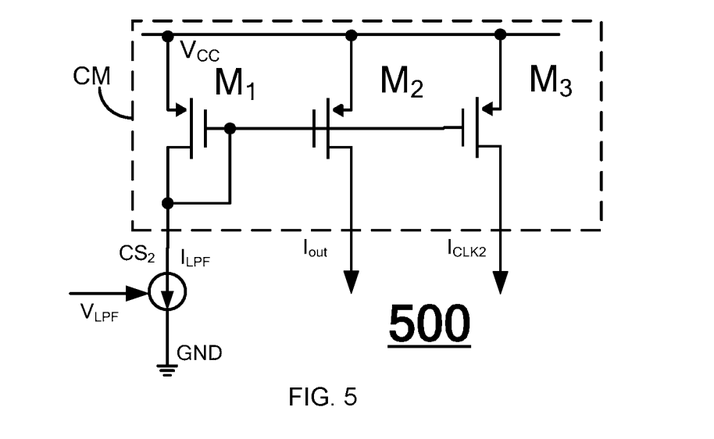
FIG. 5 illustrates an output circuit 500 used in FIG. 4 according to an embodiment of the present invention.

FIG. 5 illustrates an output circuit 500 used in FIG. 4 according to an embodiment of the present invention. As shown in FIG. 5, the output circuit 500 is configured to comprise a current mirror CM. The current mirror CM has an input terminal, a first output terminal and a second output terminal. The input terminal of the current mirror CM is coupled to the controlled current source $CS_2$. The current mirror CM is configured to generate an output current $I_{OUT}$ proportional to the controlled current $I_{LPF}$ at the first output terminal according to the controlled current $I_{LPF}$ and to also generate a calibration current $I_{CLK2}$ proportional to the controlled current $I_{LPF}$ at the second output terminal. Combining the calibration clock generating circuit 402 of FIG. 4 and the output circuit 500 of FIG. 5, the calibration clock generating circuit 402 is coupled to the current mirror CM to receive the calibration current $I_{CLK2}$ and is configured to generate the calibration clock signal CLK2 with the frequency thereof being proportional to the calibration current $I_{CLK2}$. Further, the current mirror CM is configured to comprise a first switch $M_1$, a second switch $M_2$ and a third switch $M_3$, all of which have a first terminal, a second terminal and a control terminal. The first terminals of the first switch $M_1$, the second switch $M_2$ and the third switch $M_3$ are all coupled to a supply voltage $V_{CC}$, and the control terminals of the first switch $M_1$, the second switch $M_2$ and the third switch $M_3$ are all coupled together. The second terminal of the first switch $M_1$ operates as the input terminal of the current mirror CM and is coupled to the controlled current source $CS_2$ to receive the controlled current $I_{LPF}$, and the second terminals of the second switch $M_2$ and the third switch $M_3$ operate respectively as the first output terminal and the second output terminal of the current mirror CM to output currents respectively as the output current $I_{OUT}$ of the output circuit 500 and the calibration current $I_{CLK2}$. According to the operation principle of a current mirror, both the calibration current $I_{CLK2}$ and the output current $I_{OUT}$ are proportional to the controlled current $I_{LPF}$, and the scale factor corresponding to the calibration current $I_{CLK2}$ is relevant to the sizes of the second transistor $M_2$ and of the first transistor $M_1$ and the scale factor corresponding to the output current $I_{OUT}$ is relevant to the sizes of the third transistor $M_3$ and of the first transistor $M_1$. In an embodiment, the second transistor $M_2$ and the third transistor $M_3$ have the same size. Persons of ordinary skill in the art will understand, the configuration of the output circuit 500 of FIG. 5 is only for illustration, any other appropriate configuration which makes the output current $I_{OUT}$ proportional to the calibration current $I_{CLK2}$ may be also implemented in the present invention. For example, in an embodiment, an output circuit may comprise a first controlled current source which has an input terminal and an output terminal, wherein the input terminal of the first controlled current source is coupled to the low-pass filtering circuit to receive the filtering signal $V_{LPF}$ and the first controlled current source is configured to generate a current proportional to the filtering signal $V_{LPF}$ as an output signal under the control of the filtering signal $V_{LPF}$.

In this way, the output current $I_{OUT}$ is also proportional to the calibration current $I_{CLK2}$. By implementing the output circuit 500 of FIG. 5, the voltage controlled oscillating circuit 400 of FIG. 4 and the phase locked loop 300 of FIG. 3 all in the current generating circuit 100 of FIG. 1, we can get that the output current $I_{OUT}$ is directly proportional to the frequency $f_{CLK2}$ as the output current $I_{OUT}$ is proportional to the calibration current $I_{CLK2}$ while the frequency $f_{CLK2}$ of the calibration current $I_{CLK2}$ is directly proportional to the controlled current $I_{LPF}$.

Figure 6:
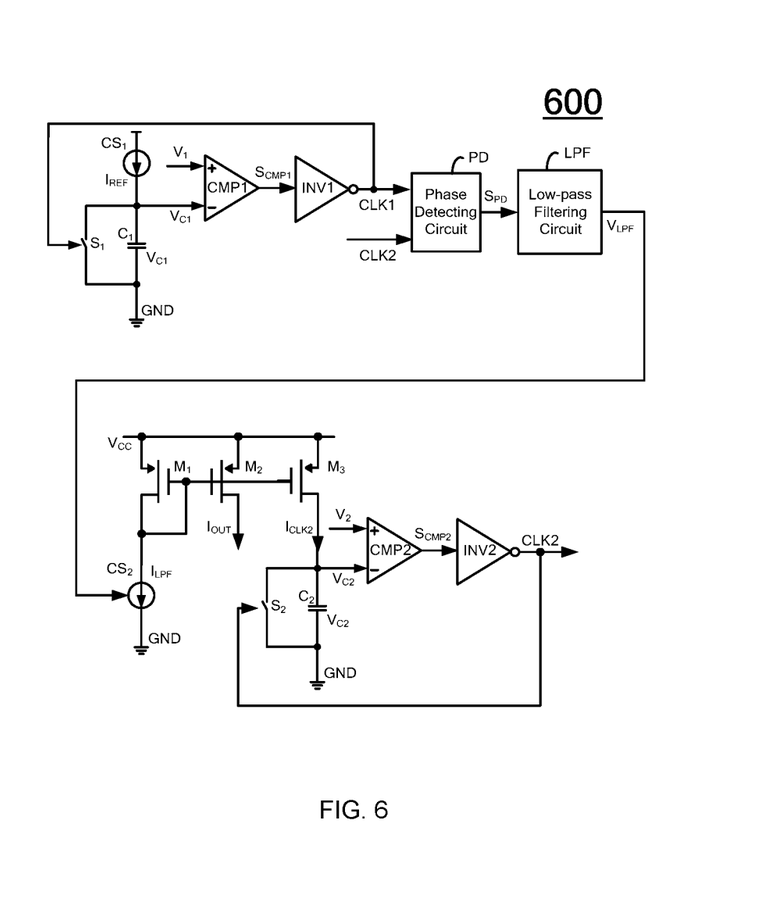
FIG. 6 illustrates a current generating circuit 600 with implementation of the circuits of FIG. 2~5.

FIG. 6 illustrates a current generating circuit 600 with implementation of the circuits of FIG. 2~5. From the above description of the operating principal of the reference clock generating circuit 200 of FIG. 2, we get:

$$f_{CLK1} = \frac{k \times V_{REF}}{V_1 \times C_1}$$

From the above description of the operating principal of the calibration clock generating circuit 402 of FIG. 4, we get:

$$f_{CLK2} = \frac{I_{LPF}}{V_2 \times C_2}$$

From the above description of the operating principal of the phase locked loop circuit 300 of FIG. 3, we get:

$$f_{CLK1} = f_{CLK2}$$

We can get from the above equations about $f_{CLK1}$ and $f_{CLK2}$:

$$I_{LPF} = \frac{k \times V_{REF} \times V_2 \times C_2}{V_1 \times C_1}$$

In one embodiment, $V_1 = V_{bg}$, $V_2 = V_T \ln 8$, wherein Vbg represents a bandgap reference voltage, $V_T$ represents a thermal voltage, and in addition, C1=C2, we get:

$$I_{LPF} = \frac{k \times V_{REF} \times V_T \ln 8}{V_{bg}}$$

In the embodiment of FIG. 5, all the transistors M1, M2 and M3 have the same size, we get:

$$I_{OUT} = \frac{k \times V_{REF} \times V_T \ln 8}{V_{bg}}$$

It is known from the above description, the output current $I_{OUT}$ generated from the above circuits is directly proportional to the reference voltage $V_{REF}$, which makes that the output current $I_{OUT}$ can be used in applications where an output current proportional to a reference voltage is required. In particular, the output current can be used as a PTAT current which is required to be proportional to a reference voltage.

Figure 7:
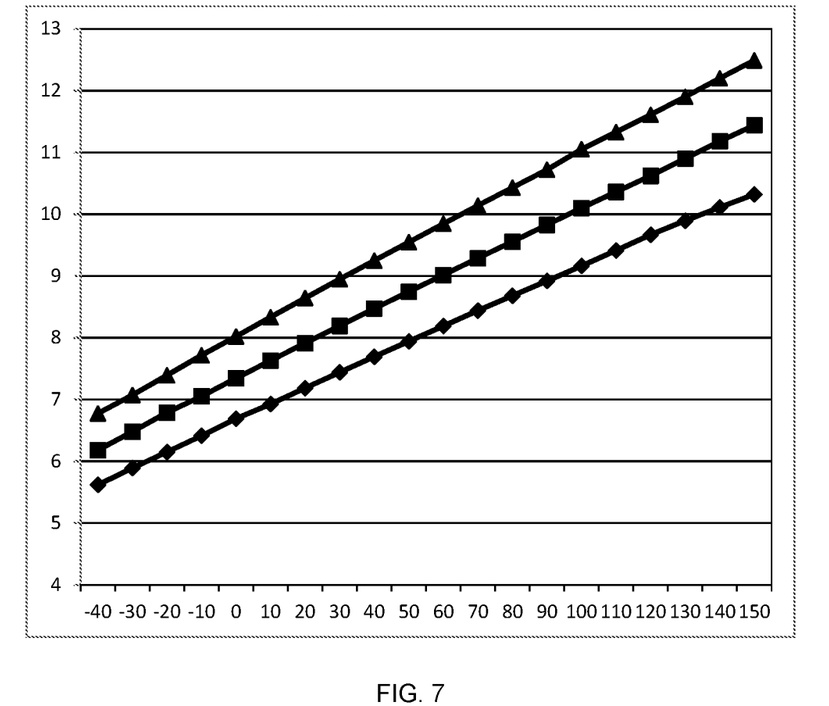
FIG. 7 illustrates the simulation result of the current generating circuit 600 of FIG. 6.

FIG. 7 illustrates the simulation result of the current generating circuit 600 of FIG. 6. The longitudinal coordinate represents the output current, and FIG. 7 shows the output currents when the reference voltage $V_{REF}$ is respectively set as 3V, 3.3V and 3.6V. From FIG. 7, we know that, the output current vary with the reference voltage $V_{REF}$, in other words, the output current is relevant to the reference voltage $V_{REF}$.

Figure 8:
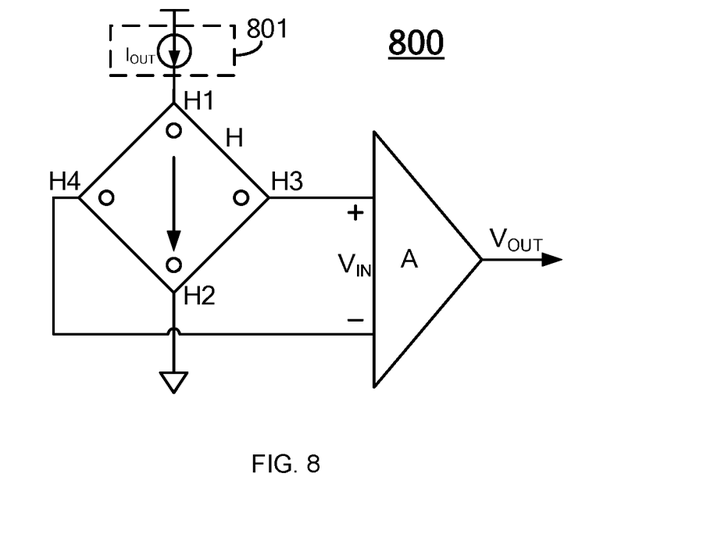
FIG. 8 illustrates a hall circuit 800 in accordance with an embodiment of the present invention.

FIG. 8 illustrates a hall circuit 800 in accordance with an embodiment of the present invention. As shown in FIG. 8, the hall circuit 800 is configured to comprise a current generating circuit 801 generating an output current $I_{OUT}$, wherein the output current $I_{OUT}$ is proportional to a reference voltage. The current generating circuit 801 may be implemented with any combination of the circuits shown in FIG. 1~7. The hall circuit 800 is also configured to comprise a hall sensor H coupled to the current generating circuit 801 to receive the output current $I_{OUT}$. The hall sensor H is configured to generate a hall voltage $V_{IN}$ according to the output current $I_{OUT}$. In more detail, the hall sensor H has a first contact H1, a second contact H2, a third contact H3 and a fourth contact H4, wherein the first contact H1 is coupled to the current generating circuit 801 to receive the output current $I_{OUT}$, the second contact H2 is coupled to a reference ground, the third contact H3 and the fourth contact H4 respectively operate as a non-inverting output terminal and an inverting output terminal of the hall sensor H to output a two-terminal hall voltage $V_{IN}$. The hall circuit 800 is also configured to comprise an amplifying system A coupled to the hall sensor H to receive the hall voltage $V_{IN}$. The amplifying system is configured to output an output voltage $V_{OUT}$ according to the hall voltage $V_{IN}$.

It will be appreciated by persons skilled in the art that the present invention is not limited to what has been particularly shown and described herein above. Rather the scope of the present invention is defined by the claims and includes both combinations and sub-combinations of the various features described hereinabove as well as variations and modifications thereof which would occur to persons skilled in the art upon reading the foregoing description and which are not in the prior art.

What is claimed is:

1. A current generating circuit, comprising:
    a reference clock generating circuit configured to generate a reference clock signal, wherein a frequency of the reference clock signal is relevant to a reference voltage;
    a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and
    an output circuit coupled to the phase locked loop circuit, wherein the phase locked loop circuit is configured to control the output circuit so that the output circuit generates an output current according to the phase difference between the calibration clock signal and the reference clock signal.

2. The current generating circuit of claim 1, wherein the frequency of the reference clock signal is proportional to the reference voltage.

3. The current generating circuit of claim 2, wherein the reference clock generating circuit comprises:
    a reference current source having an output terminal, wherein the reference current source is configured to provide a reference current proportional to the reference voltage at the output terminal;
    a first capacitor and a first switch both coupled between the output terminal of the reference current source and a reference ground, wherein across the first capacitor there exists a first capacitor voltage;
    a first comparator having a first input terminal, a second input terminal and an output terminal, wherein the first input terminal is configured to receive a first voltage and the second input terminal is coupled to the output terminal of the reference current source, and wherein the first comparator is configured to compare the first voltage with the first capacitor voltage and to generate a first comparison signal at the output terminal; and
    a first inverter having an input terminal and an output terminal, wherein the input terminal of the first inverter is coupled to the output terminal of the first comparator and the first inverter is configured to generate the reference clock signal at the output terminal, and wherein the reference clock is provided to control the on and off operations of the first switch.

4. The current generating circuit of claim 1, wherein the phase locked loop circuit comprises:
    a phase detecting circuit having a first input terminal, a second input terminal and an output terminal, wherein the first input terminal is coupled to the reference clock generating circuit to receive the reference clock signal, and the second input terminal is configured to receive the calibration clock signal, and wherein the phase detecting circuit is configured to generate a voltage error signal according to the phase difference between the calibration clock signal and the reference clock signal;
    a low-pass filtering circuit having an input terminal and an output terminal, wherein the input terminal is coupled to the phase detecting circuit to receive the voltage error signal, and wherein the low-pass filtering circuit is configured to filter the high frequency of the voltage error signal to generate a filtering signal at the output terminal; and
    a voltage controlled oscillating circuit having an input terminal and an output terminal, wherein the input terminal is coupled to the low-pass filtering circuit to receive the filtering signal, and wherein the voltage controlled oscillating circuit is configured to generate the calibration clock signal at the output terminal and to regulate the frequency of the calibration clock signal according to the filtering signal so as to reduce the phase difference between the calibration clock signal and the reference clock signal.

5. The current generating circuit of claim 4, wherein the average value of the voltage error signal is in a linear relationship with the phase difference between the calibration clock signal and the reference clock signal.

6. The current generating circuit of claim 4, wherein the voltage controlled oscillating circuit comprises:
    a controlled current source coupled to the low-pass filtering circuit to receive the filtering signal, wherein the controlled current source is configured to generate a controlled current proportional to the filtering signal under the control the filtering signal; and
    a calibration clock generating circuit coupled to the controlled current source and configured to generate the calibration clock signal according to the controlled current, wherein the frequency of the calibration clock signal is proportional to the controlled current.

7. The current generating circuit of claim 6, wherein the calibration clock generating circuit comprises:
    a second capacitor and a second switch both coupled to the controlled current source and the reference ground, wherein across the second capacitor there exists a second capacitor voltage;
    a second comparator having a first input terminal and a second input terminal and an output terminal, wherein the first input terminal is configured to receive a second voltage, and the second input terminal is coupled to the second capacitor to receive the second capacitor voltage, and wherein the second comparator is configured to compare the second voltage with the second capacitor voltage and to generate a second comparison signal at the output terminal; and
    a second inverter having an input terminal and an output terminal, wherein the input terminal of the second inverter is coupled to the output terminal of the second comparator and the second inverter is configured to generate the calibration clock signal at the output terminal, and wherein the calibration clock signal is provided to control the on and off operations of the second switch.

8. The current generating circuit of claim 6, wherein the output circuit is configured to comprise a current mirror having an input terminal, a first output terminal and a second output terminal, and wherein the input terminal is coupled to the controlled current source to receive the controlled current, the current mirror is configured to generate an output current proportional to the controlled current at the first output terminal and a calibration current proportional to the controlled current at the second output terminal, and wherein the calibration clock generating circuit is coupled to the second output terminal of the current mirror to receive the calibration current and is configured to generate the calibration clock signal according to the calibration current.

9. The current generating circuit of claim 4, wherein the output circuit is configured to comprise a first controlled current source having an input terminal and an output terminal, and wherein the input terminal of the first current source is coupled the low-pass filtering circuit to receive the filtering signal and the first controlled current source is configured to generate a current proportional to the filtering signal as the output current under the control of the filtering signal.

10. A hall circuit, comprising:
a current generating circuit configured to generate an output current, wherein the current generating circuit is configured to comprise:
a reference clock generating circuit configured to generate a reference clock signal, wherein the frequency of the reference clock signal is relevant to a reference voltage;
a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and
an output circuit coupled to the phase locked loop circuit, wherein the phase locked loop circuit is configured to control the output circuit so that the output circuit generates an output current according to the phase difference between the calibration clock signal and the reference clock signal;
a hall sensor coupled to the current generating circuit to receive the output current, wherein the hall sensor is configured to generate a hall voltage according to the output current; and
an amplifying system coupled to the hall sensor to receive the hall voltage and configured to generate an output voltage according to the hall voltage.

11. The hall circuit of claim 10, wherein the frequency of the reference clock signal is proportional to the reference voltage.

12. The hall circuit of claim 11, wherein the reference clock generating circuit comprises:
a reference current source having an output terminal, wherein the reference current source is configured to provide a reference current proportional to the reference voltage at the output terminal;
a first capacitor and a first switch both coupled between the output terminal of the reference current source and a reference ground, wherein across the first capacitor there exists a first capacitor voltage;
a first comparator having a first input terminal, a second input terminal and an output terminal, wherein the first input terminal is configured to receive a first voltage and the second input terminal is coupled to the output terminal of the reference current source, and wherein the first comparator is configured to compare the first voltage with the first capacitor voltage and to generate a first comparison signal at the output terminal; and
a first inverter having an input terminal and an output terminal, wherein the input terminal of the first inverter is coupled to the output terminal of the first comparator and the first inverter is configured to generate the reference clock signal at the output terminal, and wherein the reference clock is provided to control the on and off operations of the first switch.

13. The hall circuit of claim 10, wherein the phase locked loop circuit comprises:
a phase detecting circuit having a first input terminal, a second input terminal and an output terminal, wherein the first input terminal is coupled to the reference clock generating circuit to receive the reference clock signal, and the second input terminal is configured to receive the calibration clock signal, and wherein the phase detecting circuit is configured to generate a voltage error signal according to the phase difference between the calibration clock signal and the reference clock signal;
a low-pass filtering circuit having an input terminal and an output terminal, wherein the input terminal is coupled to the phase detecting circuit to receive the voltage error signal, and wherein the low-pass filtering circuit is configured to filter the high frequency of the voltage error signal to generate a filtering signal at the output terminal; and
a voltage controlled oscillating circuit having an input terminal and an output terminal, wherein the input terminal is coupled to the low-pass filtering circuit to receive the filtering signal, and wherein the voltage controlled oscillating circuit is configured to generate the calibration clock signal at the output terminal and to regulate the frequency of the calibration clock signal according to the filtering signal so as to reduce the phase difference between the calibration clock signal and the reference clock signal.

14. The hall circuit of claim 13, wherein the average value of the voltage error signal is in a linear relationship with the phase difference between the calibration clock signal and the reference clock signal.

15. The hall circuit of claim 13, wherein the voltage controlled oscillating circuit comprises:
a controlled current source coupled to the low-pass filtering circuit to receive the filtering signal, wherein the controlled current source is configured to generate a controlled current proportional to the filtering signal under the control the filtering signal; and
a calibration clock generating circuit coupled to the controlled current source and configured to generate the calibration clock signal according to the controlled current, wherein the frequency of the calibration clock signal is proportional to the controlled current.

16. The hall circuit of claim 15, wherein the calibration clock generating circuit comprises:
a second capacitor and a second switch both coupled to the controlled current source and the reference ground, wherein across the second capacitor there exists a second capacitor voltage;

a second comparator having a first input terminal and a second input terminal and an output terminal, wherein the first input terminal is configured to receive a second voltage, and the second input terminal is coupled to the second capacitor to receive the second capacitor voltage, and wherein the second comparator is configured to compare the second voltage with the second capacitor voltage and to generate a second comparison signal at the output terminal; and a second inverter having an input terminal and an output terminal, wherein the input terminal of the second inverter is coupled to the output terminal of the second comparator and the second inverter is configured to generate the calibration clock signal at the output terminal, and wherein the calibration clock signal is provided to control the on and off operations of the second switch.

17. The hall circuit of claim 15, wherein the output circuit is configured to comprise a current mirror having an input terminal, a first output terminal and a second output terminal, and wherein the input terminal is coupled to the controlled current source to receive the controlled current, the current mirror is configured to generate an output current proportional to the controlled current at the first output terminal and a calibration current proportional to the controlled current at the second output terminal, and wherein the calibration clock generating circuit is coupled to the second output terminal of the current mirror to receive the calibration current and is configured to generate the calibration clock signal according to the calibration current.

18. The hall circuit of claim 13, wherein the output circuit is configured to comprise a first controlled current source having an input terminal and an output terminal, and wherein the input terminal of the first current source is coupled the low-pass filtering circuit to receive the filtering signal and the first controlled current source is configured to generate a current proportional to the filtering signal as the output current under the control of the filtering signal.

19. A current generating circuit, comprising:
a reference clock generating circuit configured to generate a reference clock signal, wherein the reference clock generating circuit comprises:
a reference current source having an output terminal, wherein the reference current source is configured to provide a reference current proportional to the reference voltage at the output terminal;
a first capacitor and a first switch both coupled between the output terminal of the reference current source and a reference ground, wherein across the first capacitor there exists a first capacitor voltage;
a first comparator having a first input terminal, a second input terminal and an output terminal, wherein the first input terminal is configured to receive a first voltage and the second input terminal is coupled to the output terminal of the reference current source, and wherein the first comparator is configured to compare the first voltage with the first capacitor voltage and to generate a first comparison signal at the output terminal; and a first inverter having an input terminal and an output terminal, wherein the input terminal of the first inverter is coupled to the output terminal of the first comparator and the first inverter is configured to generate the reference clock signal at the output terminal, and wherein the reference clock is provided to control the on and off operations of the first switch;

a phase locked loop circuit configured to generate a calibration clock signal, wherein the phase locked loop circuit is configured to receive the reference clock signal and the calibration clock signal and to regulate the calibration clock signal according to the phase difference between the calibration clock signal and the reference clock signal so as to reduce the phase difference; and an output circuit coupled to the phase locked loop circuit, wherein the phase locked loop circuit is configured to control the output circuit so that the output circuit generates an output current according to the phase difference between the calibration clock signal and the reference clock signal.

20. The current generating circuit of claim 19, wherein the phase locked loop circuit comprises:
a phase detecting circuit having a first input terminal, a second input terminal and an output terminal, wherein the first input terminal is coupled to the reference clock generating circuit to receive the reference clock signal, and the second input terminal is configured to receive the calibration clock signal, and wherein the phase detecting circuit is configured to generate a voltage error signal according to the phase difference between the calibration clock signal and the reference clock signal;
a low-pass filtering circuit having an input terminal and an output terminal, wherein the input terminal is coupled to the phase detecting circuit to receive the voltage error signal, and wherein the low-pass filtering circuit is configured to filter the high frequency of the voltage error signal to generate a filtering signal at the output terminal; and
a voltage controlled oscillating circuit having an input terminal and an output terminal, wherein the input terminal is coupled to the low-pass filtering circuit to receive the filtering signal, and wherein the voltage controlled oscillating circuit is configured to generate the calibration clock signal at the output terminal and to regulate the frequency of the calibration clock signal according to the filtering signal so as to reduce the phase difference between the calibration clock signal and the reference clock signal.

* * * * *